(12) United States Patent
Hiew et al.

(10) Patent No.: US 8,102,662 B2
(45) Date of Patent: Jan. 24, 2012

(54) USB PACKAGE WITH BISTABLE SLIDING MECHANISM

(75) Inventors: Siew S. Hiew, San Jose, CA (US); Nan Nan, San Jose, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 302 days.

(21) Appl. No.: 12/552,250

(22) Filed: Sep. 1, 2009

(65) Prior Publication Data
US 2009/0316368 A1 Dec. 24, 2009

Related U.S. Application Data

(63) Continuation-in-part of application No. 11/773,830, filed on Jul. 5, 2007, now Pat. No. 7,872,871, and a continuation-in-part of application No. 12/419,187, filed on Apr. 6, 2009.

(51) Int. Cl.
*H05K 7/12* (2006.01)
(52) U.S. Cl. ......... 361/752; 439/131; 439/135; 439/141
(58) Field of Classification Search .................. 361/737, 361/752; 439/131, 135, 141
See application file for complete search history.

(56) References Cited

U.S. PATENT DOCUMENTS

| | | |
|---|---|---|
| 4,686,506 A | 8/1987 | Farago |
| 4,818,239 A | 4/1989 | Erk |
| 5,330,360 A | 7/1994 | Marsh et al. |
| 5,339,222 A | 8/1994 | Simmons et al. |
| 5,386,340 A | 1/1995 | Kurz |
| 5,397,857 A | 3/1995 | Farquhar et al. |
| 5,404,485 A | 4/1995 | Ban |
| 5,414,597 A | 5/1995 | Lindland et al. |
| 5,420,412 A | 5/1995 | Kowaiski |
| 5,430,859 A | 7/1995 | Norman et al. |
| 5,450,396 A | 9/1995 | Havermans |
| 5,476,387 A | 12/1995 | Ramey et al. |
| 5,479,638 A | 12/1995 | Assar et al. |
| 5,530,622 A | 6/1996 | Takiar et al. |
| 5,623,552 A | 4/1997 | Lane |
| 5,718,599 A | 2/1998 | Ichikawa et al. |
| 5,725,395 A | 3/1998 | Lee et al. |
| 5,766,033 A | 6/1998 | Davis |

(Continued)

OTHER PUBLICATIONS

USB 'A' Plug Form Factor, Revision 0.9, Guideline for Embedded USB Device Applications, Nov. 29, 2004, 4 pages.

(Continued)

*Primary Examiner* — Dameon Levi
(74) *Attorney, Agent, or Firm* — Bever, Hoffman & Harms, LLP; Patrick T. Bever

(57) ABSTRACT

A USB device including a bistable mechanism that serves to bias a plug connector into one of two stable states, where the first stable state is associated with a retracted position in which the plug connector is fully retracted inside a housing, and the second stable state is associated with a deployed position in which the plug connector extends through the front opening for coupling to a host system. Movement of the plug connector form the retracted to the deployed position is performed by manually applying a force to a handle portion that protrudes through a slot defined in the housing. The bistable mechanism resists the deploying force until an equilibrium point is reach, after which the bistable mechanism releases stored potential energy to complete the deploying process and to maintain the plug connector is the deployed position.

14 Claims, 12 Drawing Sheets

U.S. PATENT DOCUMENTS

| | | | |
|---|---|---|---|
| 5,772,453 A | 6/1998 | Tan et al. |
| 5,821,614 A | 10/1998 | Hashimoto et al. |
| 5,835,760 A | 11/1998 | Harmer |
| 5,907,856 A | 5/1999 | Estakhri et al. |
| 5,941,733 A | 8/1999 | Lai et al. |
| 5,959,541 A | 9/1999 | DiMaria et al. |
| 6,000,006 A | 12/1999 | Bruce et al. |
| 6,012,636 A | 1/2000 | Smith |
| 6,027,375 A | 2/2000 | Wu et al. |
| 6,044,428 A | 3/2000 | Rayabhari |
| 6,069,920 A | 5/2000 | Schulz et al. |
| 6,081,858 A | 6/2000 | Abudayyeh et al. |
| 6,089,879 A | 7/2000 | Babcock |
| 6,091,605 A | 7/2000 | Ramey et al. |
| 6,125,192 A | 9/2000 | Bjorn et al. |
| 6,148,354 A | 11/2000 | Ban et al. |
| 6,165,016 A | 12/2000 | Lai |
| 6,193,152 B1 | 2/2001 | Fernando et al. |
| 6,202,138 B1 | 3/2001 | Estakhri et al. |
| 6,230,233 B1 | 5/2001 | Lofgren et al. |
| 6,231,363 B1 | 5/2001 | Kosmala |
| 6,241,534 B1 | 6/2001 | Neer et al. |
| 6,275,894 B1 | 8/2001 | Kuo et al. |
| 6,292,863 B1 | 9/2001 | Terasaki et al. |
| 6,297,448 B1 | 10/2001 | Hara |
| 6,313,400 B1 | 11/2001 | Mosquera et al. |
| 6,314,479 B1 | 11/2001 | Frederick et al. |
| 6,321,478 B1 | 11/2001 | Klebes |
| 6,334,793 B1 | 1/2002 | Amoni et al. |
| 6,354,883 B2 | 3/2002 | Jaing |
| 6,385,677 B1 | 5/2002 | Yao |
| 6,438,638 B1 | 8/2002 | Jones et al. |
| 6,439,464 B1 | 8/2002 | Fruhauf et al. |
| 6,445,088 B1 | 9/2002 | Spitaels et al. |
| 6,453,371 B1 | 9/2002 | Hampson et al. |
| 6,475,830 B1 | 11/2002 | Brillhart |
| 6,490,163 B1 | 12/2002 | Pua et al. |
| 6,533,612 B1 | 3/2003 | Lee et al. |
| 6,547,130 B1 | 4/2003 | Shen |
| 6,554,648 B2 | 4/2003 | Shi et al. |
| 6,561,421 B1 | 5/2003 | Yu |
| 6,567,273 B1 | 5/2003 | Liu et al. |
| 6,578,768 B1 | 6/2003 | Binder et al. |
| 6,581,122 B1 | 6/2003 | Sarat |
| 6,599,152 B1 | 7/2003 | Oliphant et al. |
| 6,602,088 B1 | 8/2003 | Zhu |
| 6,609,928 B1 | 8/2003 | Le |
| 6,615,404 B1 | 9/2003 | Garfunkel et al. |
| 6,618,243 B1 | 9/2003 | Tirosh |
| 6,624,005 B1 | 9/2003 | DiCaprio et al. |
| 6,628,498 B2 | 9/2003 | Whitney et al. |
| 6,636,929 B1 | 10/2003 | Frantz et al. |
| 6,658,516 B2 | 12/2003 | Yao |
| 6,659,805 B2 | 12/2003 | Siddiqui et al. |
| 6,671,808 B1 | 12/2003 | Abbott et al. |
| 6,676,420 B1 | 1/2004 | Liu et al. |
| 6,692,268 B2 | 2/2004 | Kung et al. |
| 6,692,312 B1 | 2/2004 | Semmeling et al. |
| 6,705,902 B1 | 3/2004 | Yi et al. |
| 6,712,646 B2 | 3/2004 | Shindo |
| 6,718,407 B2 | 4/2004 | Martwick |
| 6,719,570 B2 | 4/2004 | Tsuchioka |
| 6,733,329 B2 | 5/2004 | Yang |
| 6,745,267 B2 | 6/2004 | Chen et al. |
| 6,752,321 B1 | 6/2004 | Leaming |
| 6,757,783 B2 | 6/2004 | Koh |
| 6,758,685 B1 | 7/2004 | Huang et al. |
| 6,763,408 B1 | 7/2004 | Sonoda |
| 6,763,410 B2 | 7/2004 | Yu |
| 6,773,192 B1 | 8/2004 | Chao |
| 6,778,401 B1 | 8/2004 | Yu et al. |
| 6,801,971 B1 | 10/2004 | Devine et al. |
| 6,808,400 B2 * | 10/2004 | Tu ................ 439/131 |
| 6,813,662 B2 | 11/2004 | Park |
| 6,832,281 B2 | 12/2004 | Jones et al. |
| 6,854,984 B1 | 2/2005 | Lee et al. |
| 6,857,897 B2 | 2/2005 | Conn |
| 6,860,609 B2 | 3/2005 | Olson et al. |
| 6,871,244 B1 | 3/2005 | Cahill et al. |
| 6,874,044 B1 | 3/2005 | Chou et al. |
| 6,880,024 B2 | 4/2005 | Chen et al. |
| 6,890,207 B2 | 5/2005 | Kobayashi |
| 6,900,988 B2 | 5/2005 | Yen |
| 6,908,038 B1 | 6/2005 | Le |
| 6,908,330 B2 | 6/2005 | Garrett et al. |
| 6,932,629 B2 | 8/2005 | Ikenoue |
| 6,940,153 B2 | 9/2005 | Spencer et al. |
| 6,944,028 B1 | 9/2005 | Yu et al. |
| 6,979,210 B2 | 12/2005 | Regen et al. |
| 6,980,188 B1 | 12/2005 | Worley, III et al. |
| 7,004,780 B1 | 2/2006 | Wang |
| 7,009,847 B1 | 3/2006 | Wu et al. |
| 7,011,247 B2 | 3/2006 | Drabczuk et al. |
| 7,015,148 B1 * | 3/2006 | Lukanc et al. ................ 438/736 |
| 7,021,971 B2 | 4/2006 | Chou et al. |
| 7,103,765 B2 | 9/2006 | Chen |
| 7,104,807 B1 | 9/2006 | Wang et al. |
| 7,104,809 B1 | 9/2006 | Huang |
| 7,104,814 B1 * | 9/2006 | She et al. ................ 439/131 |
| 7,104,848 B1 | 9/2006 | Chou et al. |
| 7,108,560 B1 | 9/2006 | Chou et al. |
| 7,125,287 B1 | 10/2006 | Chou et al. |
| 7,153,148 B2 | 12/2006 | Chen et al. |
| 7,182,646 B1 | 2/2007 | Chou et al. |
| 7,186,147 B1 | 3/2007 | Chou et al. |
| 7,249,978 B1 | 7/2007 | Ni |
| 7,257,714 B1 | 8/2007 | Shen |
| 7,296,098 B2 | 11/2007 | Shih |
| 7,307,849 B2 * | 12/2007 | Ho et al. ................ 361/737 |
| 7,361,032 B2 * | 4/2008 | Loftus ................ 439/131 |
| 7,364,090 B2 | 4/2008 | Cuellar et al. |
| 7,416,419 B2 | 8/2008 | Collantes, Jr. et al. |
| 7,422,454 B1 | 9/2008 | Tang et al. |
| 7,704,084 B1 * | 4/2010 | Cheng ................ 439/131 |
| 7,869,219 B2 * | 1/2011 | Ma et al. ................ 361/737 |
| 2001/0038547 A1 | 11/2001 | Jigour et al. |
| 2001/0043174 A1 | 11/2001 | Jacobsen et al. |
| 2002/0036922 A1 | 3/2002 | Roohparvar |
| 2002/0116668 A1 | 8/2002 | Chhor et al. |
| 2002/0166023 A1 | 11/2002 | Nolan et al. |
| 2003/0038043 A1 | 2/2003 | Painsith |
| 2003/0046510 A1 | 3/2003 | North |
| 2003/0094490 A1 | 5/2003 | Lee |
| 2003/0100203 A1 | 5/2003 | Yen |
| 2003/0104835 A1 | 6/2003 | Douhet |
| 2003/0145141 A1 | 7/2003 | Chen et al. |
| 2003/0154340 A1 | 8/2003 | Bolt et al. |
| 2003/0163656 A1 | 8/2003 | Ganton |
| 2003/0177300 A1 | 9/2003 | Lee et al. |
| 2003/0182528 A1 | 9/2003 | Ajiro |
| 2003/0223286 A1 | 12/2003 | Lee |
| 2003/0229748 A1 | 12/2003 | Brewer et al. |
| 2004/0034765 A1 | 2/2004 | O'Connell |
| 2004/0066693 A1 | 4/2004 | Osako |
| 2004/0087213 A1 | 5/2004 | Kao |
| 2004/0137664 A1 | 7/2004 | Elazar et al. |
| 2004/0143716 A1 | 7/2004 | Hong |
| 2004/0145875 A1 | 7/2004 | Yu et al. |
| 2004/0148482 A1 | 7/2004 | Grundy et al. |
| 2004/0153595 A1 | 8/2004 | Sukegawa et al. |
| 2004/0195339 A1 | 10/2004 | Chen et al. |
| 2004/0255054 A1 | 12/2004 | Pua et al. |
| 2005/0009388 A1 | 1/2005 | Chao |
| 2005/0048846 A1 | 3/2005 | Suzuki et al. |
| 2005/0059301 A1 | 3/2005 | Chou et al. |
| 2005/0102444 A1 | 5/2005 | Cruz |
| 2005/0114587 A1 | 5/2005 | Chou et al. |
| 2005/0120146 A1 | 6/2005 | Chen et al. |
| 2005/0160213 A1 | 7/2005 | Chen |
| 2005/0182858 A1 | 8/2005 | Lo et al. |
| 2005/0193161 A1 | 9/2005 | Lee et al. |
| 2005/0193162 A1 | 9/2005 | Chou et al. |
| 2005/0216624 A1 | 9/2005 | Deng et al. |
| 2005/0218200 A1 | 10/2005 | Focke et al. |
| 2005/0246243 A1 | 11/2005 | Adams et al. |
| 2005/0248926 A1 | 11/2005 | Asom et al. |
| 2005/0268082 A1 | 12/2005 | Poisner |

| | | |
|---|---|---|
| 2006/0065743 A1 | 3/2006 | Fruhauf |
| 2006/0075174 A1 | 4/2006 | Vuong |
| 2006/0106962 A1 | 5/2006 | Woodbridge et al. |
| 2006/0161725 A1 | 7/2006 | Lee et al. |
| 2006/0206702 A1 | 9/2006 | Fausak |
| 2006/0242395 A1 | 10/2006 | Fausak |
| 2007/0094489 A1 | 4/2007 | Ota et al. |
| 2007/0113067 A1 | 5/2007 | Oh et al. |
| 2007/0113267 A1 | 5/2007 | Iwanski et al. |
| 2007/0130436 A1 | 6/2007 | Shen |
| 2008/0093720 A1 | 4/2008 | Hiew et al. |
| 2008/0094807 A1 | 4/2008 | Hiew et al. |

OTHER PUBLICATIONS

USB FlashCard "Main Body Dimensions", "Top View", "Bottom View" Web pages, Lexar, 2004, 3 pages.

\* cited by examiner

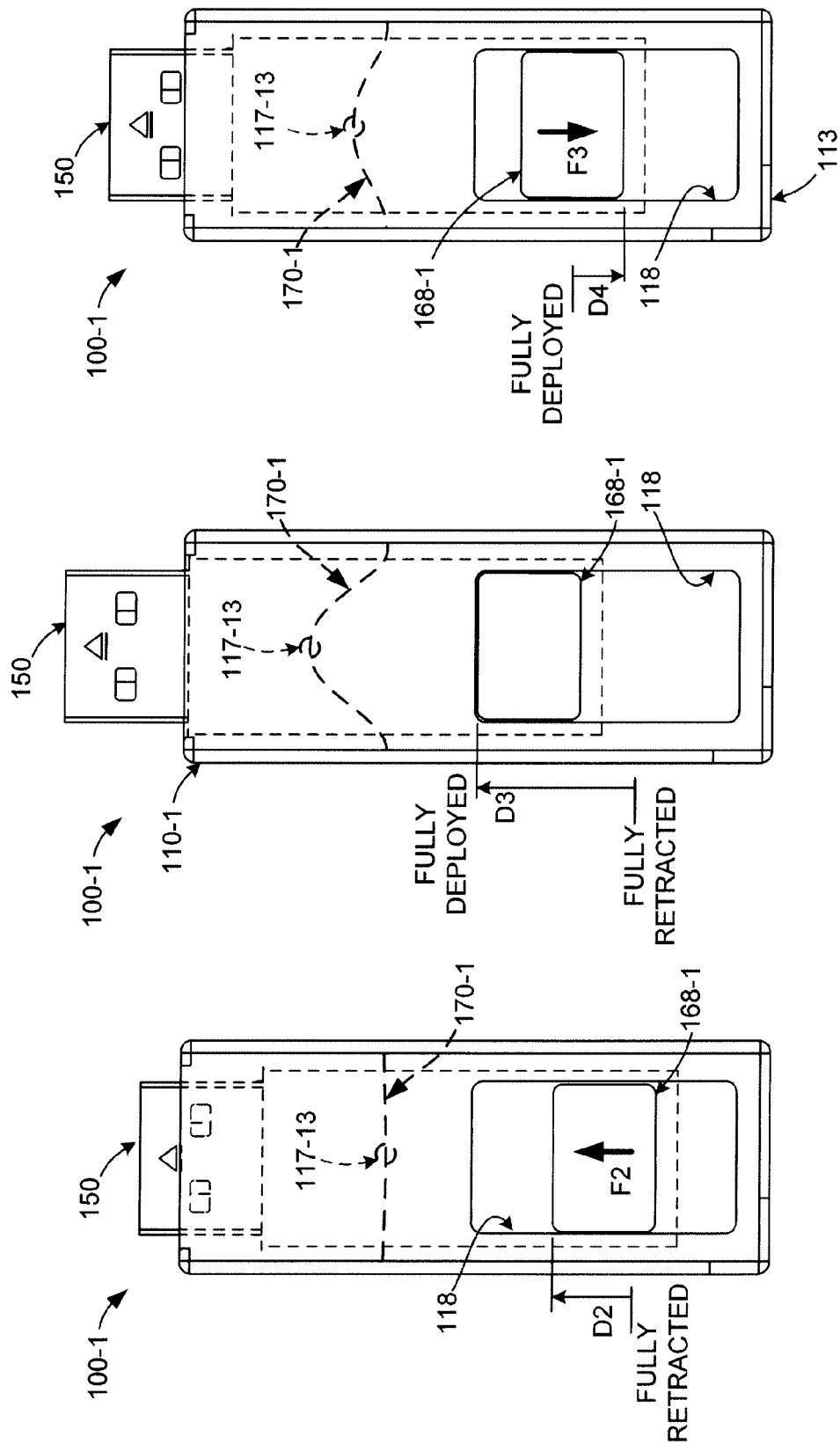

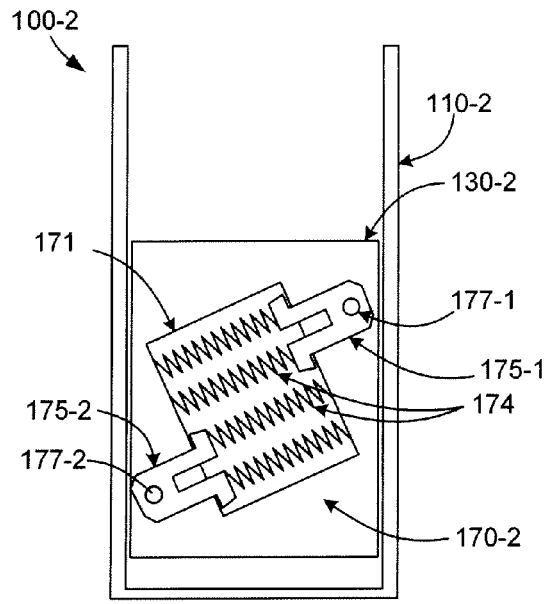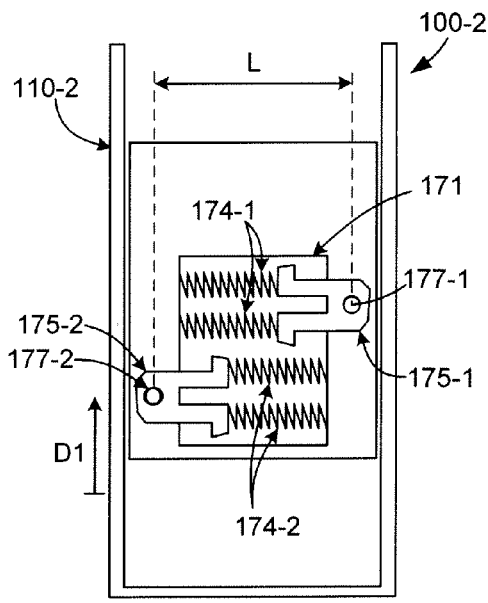
FIG. 12(A)                FIG. 12(B)
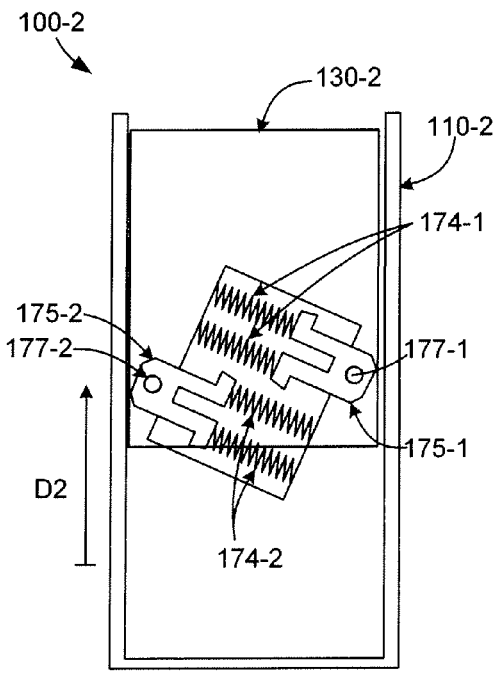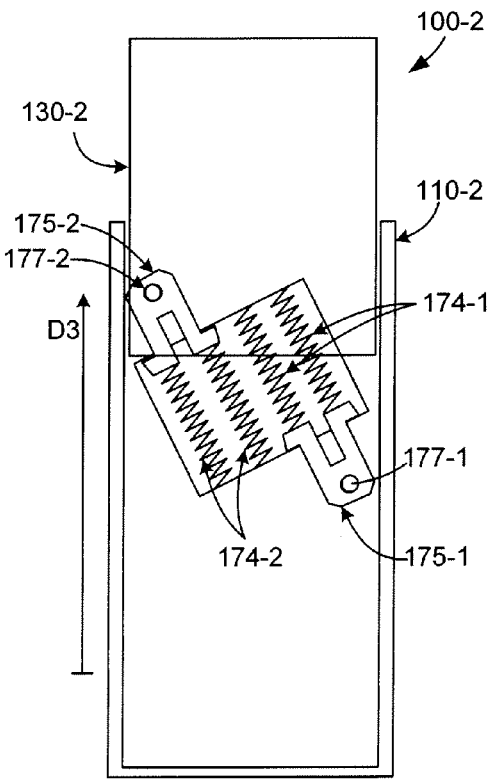
FIG. 12(C)                FIG. 12(D)

USB PACKAGE WITH BISTABLE SLIDING MECHANISM

RELATED APPLICATIONS

This application is a continuation-in-part (CIP) of U.S. patent application for "Molding Method to Manufacture Single-Chip Chip-On-Board USB Device", U.S. application Ser. No. 11/773,830, filed on Jul. 5, 2007, and a CIP of U.S. patent application for "ESD Protection For USB Memory Devices" application Ser. No. 12/419,187, filed on Apr. 6, 2009.

FIELD OF THE INVENTION

This invention relates to package designs for portable electronic devices, and more particularly to portable electronic devices such as those that utilize the Universal-Serial-Bus (USB 2.0 and USB 3.0) specifications.

BACKGROUND OF THE INVENTION

In the past, confidential data files were stored in floppy disks or were delivered via networks that require passwords or that use encryption coding for security. Confidential documents can be sent by adding safety seals and impressions during delivering. However, the aforesaid are exposed to the risks of breaking of the passwords, encryption codes, safety seals and impressions, thereby resulting in unsecure transfer of information.

More recently, there is an ongoing trend towards the use of miniaturized, portable computer peripheral devices to store confidential data. In certain cases, such peripheral devices have been reduced to "pocket size", meaning that they can literally be carried in a user's pocket in the same manner as a wallet or set of keys. One example of particular interest, in which context the present invention will be described herein, is a "flash disk", or "Universal Serial Bus (USB) flash drive".

The proliferation of portable computer peripheral devices, such as USB flash drives, has made the production of USB flash drives very cost sensitive. For example, there is currently a strong demand for high quality USB flash memory devices that are very low in cost. Such low-cost flash devices typically include a removable cap (cover) that is entirely received from the USB device so that the USB connector plug can be connected to a USB port of a host system (e.g., a computer), and is re-attached to the USB device to protect the USB connector plug when the flash memory device is not in use. A problem with such conventional USB flash devices is that the removable cover can become inadvertently lost while the device is in use, thereby leaving the USB plug connector exposed to damage or contamination that can lead to failure of the flash device, with an associated loss of valuable data.

One solution to the problem of conventional flash devices having removable caps is the so-called pen-type package in which the USB plug connector is deployed and retracted from a housing a handle or slide mechanism exposed through a slot in the housing. Although typically more expensive to produce, pen-type USB flash memory devices can be shown to have a longer effective life by avoiding the damage/failure issues associated with conventional "capped" device packages by avoiding the removable cap that can be lost. However, a problem with conventional pen-type USB flash memory devices is that the handle mechanism used to deploy the USB plug connector may be inadvertently bumped during periods of non-use, whereby the USB plug connector may be partially deployed, thereby leaving the USB plug connector exposed to damage or contamination that can lead to failure of the flash device, with an associated loss of valuable data.

What is needed is a portable computer peripheral device that overcomes the problems associated with conventional structures. What is particularly needed is a high quality pen-type USB device that has a very low production cost and avoids the partial deployment issues described above.

SUMMARY OF THE INVENTION

The present invention is directed to a pen-type computer peripheral apparatus (e.g., a USB flash memory device) including a bistable mechanism that serves to bias a plug connector into one of two stable states, where the first stable state is associated with a retracted position in which the plug connector is fully retracted inside a housing, and the second stable state is associated with a deployed position in which the plug connector extends through the front opening for coupling to a host system. Accordingly, the present invention provides the benefit associated with conventional pen-type computer peripheral devices in that the plug connector is protected (i.e., in the retracted position) when not in use without the need for a removable cover, thereby avoiding the problems described above with reference to "capped" conventional devices. In addition, the present invention provides an advantage over conventional pen-type computer peripheral devices in that the bistable mechanism prevents inadvertent partial deployment of the plug connector in response to "bumping" the device's deploying handle by biasing the plug connector back into the fully retracted position.

According to an embodiment of the present invention, a USB flash memory device includes a housing and a slidable assembly that is disposed in the housing and is biased by a bistable mechanism between the deployed and retracted positions. The housing is a substantially rectangular box-like structure having a front end portion defining a front opening, and a positioning slot defined in one of the top, bottom or side walls. The slidable assembly is disposed in the housing and includes a PCB (or other substrate) having one or more electronic devices mounted thereon, a USB plug connector connected to a front end of the substrate and positioned to move into and out of the housing through the front opening, and a manual positioning member including a handle structure that extends through the positioning slot. The bistable mechanism is also disposed inside the housing, and is connected or otherwise arranged to bias the slidable assembly into one of the retracted position the deployed position.

According to an embodiment of the present invention, the slidable assembly includes a sliding mechanism made up of a sliding boat and a rail bracket plate for supporting the PCB, also includes a pair of plastic skid structures that are mounted onto extend below the rail bracket plate that include elongated sliding edges that provide a reliable low-friction sliding rail structures for facilitating reliable sliding movement between the deployed and retracted positions. A slide base plate is disposed below the rail bracket plate and secured to the housing, and provides a smooth, flat sliding surface that further facilitates reliable low-friction sliding of the elongated sliding edges.

According to another embodiment of the present invention, the bistable mechanism is disposed between and connected to the rail bracket plate and the slide base plate of the slidable assembly in order to utilize this intervening space to maximize the volume inside the housing for the PCB. The bistable mechanism includes a spring housing, several coil springs that are disposed inside the spring housing, and a pair of spring retention structures, that are snap-coupled to the spring housing such that the springs push against pawls disposed on the inserted ends of the spring retention structures to bias the spring retention structures outward from the spring housing. Each spring retention structure also includes a base portion that is disposed outside of the spring housing and includes a stub that is rotatably coupled to either the slide base plate or the rail bracket plate. With this arrangement, when bistable mechanism is in a stable state (i.e., in either of the fully retracted or fully deployed positions), the springs push the pawls of the spring retention structures until the pawls contact and are held stationary by side edges of the spring housing. During transition between the fully deployed and fully retracted positions, the spring retention structures are pushed into the spring housing, thereby compressing the springs until the equilibrium point is reached, at which time the stored potential energy pushes spring retention structures back into one of the stable states.

BRIEF DESCRIPTION OF THE DRAWINGS

These and other features, aspects and advantages of the present invention will become better understood with regard to the following description, appended claims, and accompanying drawings, where:

FIGS. 3(A), 3(B), 3(C), 3(D) and 3(E) are simplified top views showing the device of FIG. 1(A) during operation;

FIGS. 12(A), 12(B), 12(C) and 12(D) are simplified top views depicting the bistable mechanism of the device of FIG. 4 during operation.

DETAILED DESCRIPTION OF THE DRAWINGS

The present invention is directed to pocket-sized, portable computer peripheral devices that are connected by plug connectors (e.g., USB plug connectors) to host computer systems to perform various functions. While the present invention is depicted in particular as a pen-type peripheral (i.e., USB flash drive) device, it should be appreciated that the present invention is applicable to any and all pocket-sized computer peripheral device types that are readily transportable and which may be advantageously interconnected with various host computer systems. Examples of such portable computer peripheral devices include, but are not limited to, flash memory and other data storage devices, communications devices, scanners and cameras. The term "host computer system" is used herein to refer to any electronic computer of any type or size including, but not limited to, desktop computers (PC, Mac or other), notebook computers, palmtop computers and personal digital assistant (PDA) devices.

The following description is presented to enable one of ordinary skill in the art to make and use the invention as provided in the context of a particular application and its requirements. As used herein, directional terms such as "front", "rear", "upper", "upward", "lower", "downward", "leftmost", "rightmost" and "side" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
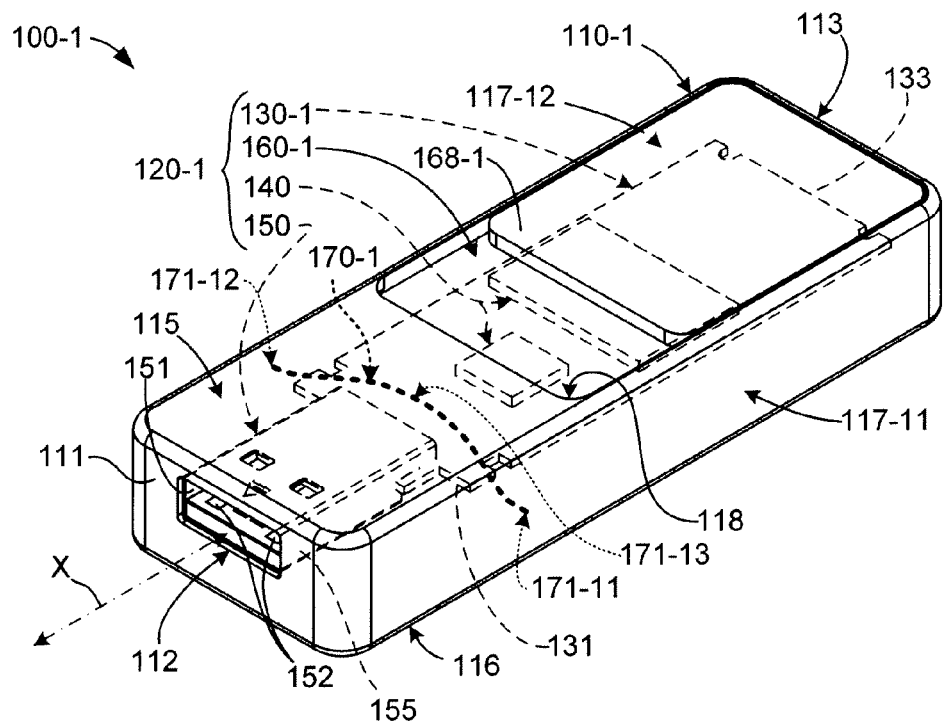
FIGS. 1(A) and 1(B) are top side perspective views showing a pen-type USB flash memory device according to a generalized embodiment of the present invention.
Figure 1B:
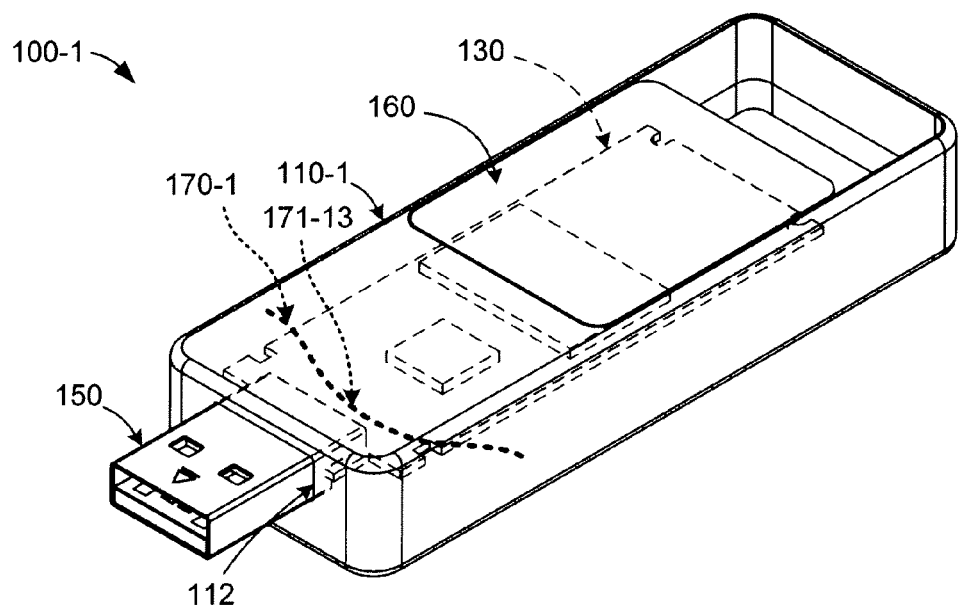

FIGS. 1(A) and 1(B) are perspective views showing a pen-type (i.e., retractable) computer peripheral device 100-1 according to a first embodiment of the present invention. Device 100-1 generally includes a housing 110-1, slidable assembly 120-1 that is slidably mounted inside of housing 110-1, and a bistable spring mechanism 170-1 that biases slidable assembly 120-1 relative to housing 110-1 into one of a fully retracted position (shown in FIG. 1(A)) and a fully deployed position (shown in FIG. 1(B)) in the manner described in detail below.

Referring to FIG. 1(A), housing 110-1 generally includes a front (first) end portion 111 that defines a front opening 112, a rear (second) portion 113, an elongated upper wall 115, an elongated lower wall 116, and opposing elongated side walls 117-11 and 117-12 that extend between side edges of upper wall 115 and lower wall 116. Upper wall 115, lower wall 116, and side walls 117-11 and 117-12 are arranged as indicated to form a generally rectangular cross-section that defines an elongated chamber extending in a longitudinal direction X between front portion 111 and rear portion 113. In addition, upper wall 115 defines a positioning slot 118 that extends in the longitudinal direction for reasons that will become clear below.

Referring to FIG. 1(A), slidable assembly 120-1 includes a printed circuit board (PCB) 130-1, at least one integrated circuit (IC) device (electronic device) 140, a plug connector 150, and a manual positioning member 160-1 that are assembled as described below.

PCB 130-1 is a substantially standard PCB that is slidably mounted within the elongated chamber defined by housing 110-1 either directly (e.g., with side edges of PCB 130-1 engaged in slots defined on the inside surfaces of side walls 117-11 and 117-12), or by way of a sliding mechanism such as that described below. PCB 130-1 has a front edge 131 that is located adjacent to front opening 112 and a back edge 133 that is located adjacent to rear portion 113 when PCBA 120-1 is mounted in housing 110-1. PCB 130-1 has opposing upper and lower surfaces that define a width (i.e., extending between opposing side edges 117-11 and 117-12) that is sized to slidably fit within housing 110-1. PCB 130-1 is formed in accordance with known PCB manufacturing techniques such electronic components 140 and passive components (not shown) are electrically interconnected by a predefined network including conductive traces and other conducting structures that are sandwiched between multiple layers of an insulating material (e.g., FR4) and adhesive.

At least one IC device 140 and/or other electronic component are mounted on or otherwise electrically connected to the upper and/or lower surface of PCB 130-1 according to well-established techniques to form an electronic circuit. IC devices 140 and associated other electronic components (not shown) that are mounted on PCB 130-1 may be selected to perform a variety of computer peripheral functions, such as those mentioned above. In an exemplary embodiment, IC devices 140 include one or more flash memory devices and a USB controller device.

Plug connector 150 is mounted onto front end 131 of PCB 130-1 such that a metal plug shell 155 defines a socket opening 151 that faces away from PCB 130, and connection pins 152 located inside socket opening 151 are generally aligned in the longitudinal direction defined by housing 110-1. In the disclosed embodiment, plug connector 150 is a standard Universal Serial Bus (USB) plug connector that is electrically connected to IC device 140 through contacts and conductive traces (not shown) that are formed on PCB 130-1 using known techniques. Metal contacts 152 are shaped and arranged in a pattern established by the USB specification, and are electronically coupled to electronic devices 140 by way of PCB 130-1 according to known techniques. Standard metal plug shell 155 is fixedly mounted onto PCB 130-1 using known techniques.

Referring to the rear portion of slidable assembly 120-1 (FIG. 1(A)), manual positioning member 160-1 is a plastic structure that is fixedly connected to PCB 130-1 and includes a handle structure 168-1 that protrudes through positioning slot 118. When PCBA 120-1 is mounted inside housing 110, manual positioning member 160-1 provides a mechanism by which a user is able to manually move plug connector 150 between a closed (first) position, in which plug connector 150 is fully retracted inside housing 110-1 (e.g., as depicted in FIG. 1(A)), and a deployed (second) position in which plug connector 150 extends through front opening 112 and is exposed outside of housing 110-1 for connection to an unillustrated host system (e.g., as depicted in FIG. 1(B)). In particular, as indicated in FIG. 1(A), when the PCBA is mounted inside of housing 110-1, a portion of handle structure 168-1 is exposed through slot 118 such that it can be manually pushed or otherwise moved by a user in longitudinal direction X defined by positioning slot 118. Because the positioning member is fixedly connected to plug connector 150 (i.e., by way of PCB 130), the retracted/deployed position of plug connector 150 can be manually changed by the user by way of the exposed portion of handle structure 168-1. For example, as indicated in FIG. 1(A), when handle structure 168 is manually positioned at a rear end of slot 118, plug connector 150 is retracted inside housing 110-1, thereby protecting plug connector 150 when not in use. Conversely, as indicated in FIG. 1(B), when a user wishes to connect peripheral device 100-1 to a host system (not shown), the user pushes the exposed portion of handle 168-1 in the manner described below to the front end of slot 118, thereby displacing PCBA relative to housing 110-1 such that plug connector 150 extends through front opening 112. The exposed plug connector 150 can then be connected to a corresponding plug structure provided on the host system to facilitate data communication between peripheral device 100-1 and the host system utilizing known communication techniques. Upon completing the data communication operation, peripheral device 100-1 is disengaged from the host system, and plug connector 150 is manually retracted back into housing 110-1 by moving handle structure 168-1 back into the position shown in FIG. 1(A).

According to the present invention, bistable mechanism 170-1 is connected between housing 110-1 and slidable assembly 120-1, and serves to bias plug connector 150 into one of the deployed position and the retracted position as described below, thereby preventing inadvertent partial deployment of plug connector 150 that can cause contamination or damage to plug connector 150. That is, as set forth in the exemplary generalized embodiment described below and in the specific embodiments described herein, bistable mechanism 170-1 serves to apply a biasing force to slidable assembly 120-1 such that PCB 130 is moved by bistable mechanism 170-1 into one of two stable states: the first stable state corresponding to the retracted position illustrated in FIG. 1(A) in which plug connector 150 is retracted inside housing 150, and the second stable state corresponding to the deployed position illustrated in FIG. 1(B) in which plug connector 150 is deployed through front opening 112. Accordingly, the present invention provides the benefit associated with conventional pen-type computer peripheral devices in that plug connector 150 is protected when not in use without the need for a removable cover. However, the present invention provides an advantage over conventional pen-type computer peripheral devices in that bistable mechanism 170-1 prevents inadvertent partial deployment of plug connector 150 by biasing plug connector 150 into one of the fully deployed or the fully retracted positions. This benefit is described in additional detail with reference to the examples provided below.

Referring to FIG. 1(A), generalized bistable mechanism 170-1 is depicted for illustrative purposes as a simple curved leaf spring having opposing first and second ends (first portions) 171-1A and 171-1B attached to side walls 117-11 and 117-13 of housing 110-1, respectively, and a central apex (second portion) 172-14 that is secured to slidable assembly 120-1. When the bistable mechanism 170-1 is in a non-inverted shape (e.g., as depicted in FIG. 1(A)), bistable mechanism 170-1 is in a first stable position in which apex 117-13 is displaced toward rear portion 113 of housing 110-1. Because slidable assembly 120-1 is attached to apex 117-13, slidable assembly 120-1 is effectively pushed by bistable mechanism 170-1 toward rear portion 113 of housing 110-1, thereby securely positioning plug connector 150 in a retracted position inside housing 110-1, as depicted in FIG. 1(A). Conversely, when the bistable mechanism 170-1 is in an inverted shape (e.g., as depicted in FIG. 1(B)), bistable mechanism 170-1 is in a second stable position in which apex 117-13 is displaced toward front portion 111 of housing 110-1, whereby slidable assembly 120-1 is pushed by bistable mechanism 170-1 toward front portion 111 of housing 110-1, and plug connector 150 is deployed through front opening 112 as depicted in FIG. 1(B). By providing bistable mechanism 170-1 with a construction in which displacement of apex 117-1C along longitudinal direction X relative to housing 110-1 during transitions between the fully retracted position (see FIG. 1(A)) and fully deployed position (see FIG. 1(B)) is equal to or greater than the displacement of plug connector 150 during such transitions, bistable mechanism 170-1 is able to provide the desired functionality of biasing plug connector 150 into either the fully deployed position or the fully retracted position.

Figure 2:
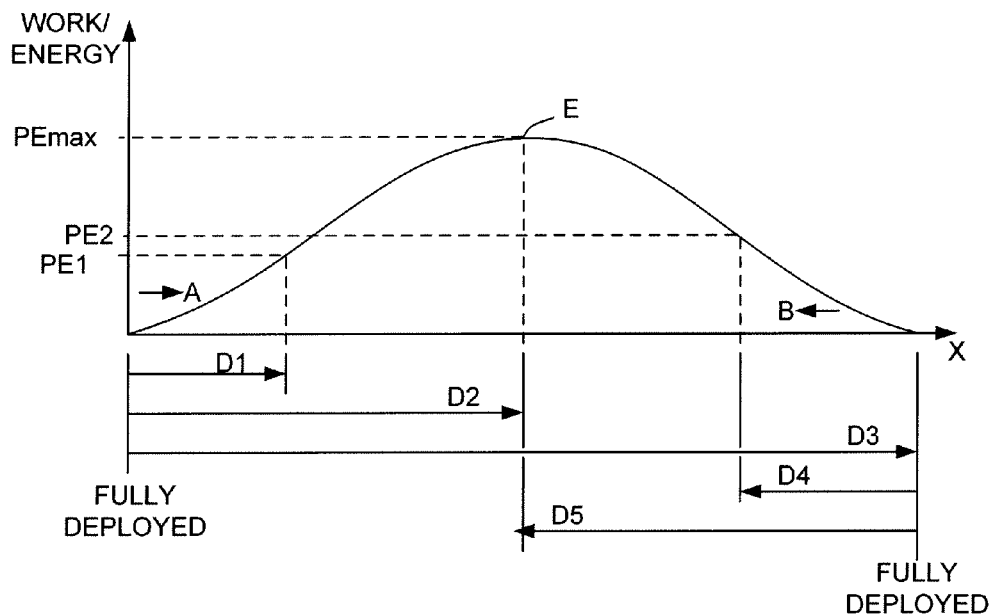
FIG. 2 is a graph showing simplified work/energy versus displacement characteristics of a bistable mechanism included in the device of FIG. 1 according to an exemplary embodiment of the present invention.

FIG. 2 is a graph showing a relationship between potential energy stored in the bistable mechanism 170-1 and displacement of apex 117-13 along the longitudinal direction X. The horizontal axis of the graph shows displacement of apex 171-13 from the fully deployed and fully retracted positions, e.g., by way of a manual force applied to handle portion 168-1 by a user. The vertical axis of the graph shows the potential energy (spring force) stored by bistable mechanism 170-1 in response to the applied manual force. The curved line in FIG. 2 shows the work/energy versus displacement characteristics associated with bistable mechanism 170-1, and indicates an equilibrium point E at which a maximum potential energy PEmax is stored. Note that the curve also indicates displacement of apex 117-13 to either side of equilibrium point E, in the absence of an applied force sufficient to maintain this position, causes bistable mechanism 170-1 to move apex 117-13 toward the nearest stable (i.e., fully-retracted or fully deployed) position. That is, if apex 117-13 is located slightly to the right of equilibrium point E, bistable mechanism 170-1 will tend to move apex 117-13 toward the fully deployed state. Conversely, if apex 117-13 is located slightly to the left of equilibrium point E, bistable mechanism 170-1 will tend to move apex 117-13 toward the fully retracted state. The work/energy versus displacement characteristics indicated by the graph shown in FIG. 2 are described in additional detail below with reference to FIGS. 3(A) to 3(E).

Figure 3A:
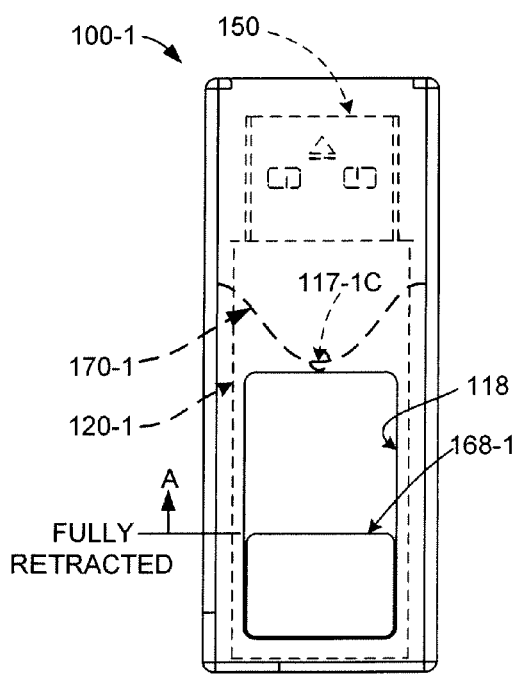

FIG. 3(A) is a simplified top view showing device 100-1 in the fully retracted position similar to that shown in FIG. 1(A). In this state plug connector 150 is disposed entirely inside housing 110-1, and handle structure 168-1 is disposed at a rearmost position in positioning slot 118 (and, hence, apex 117-13 of bistable mechanism 170-1 is also disposed in a rearmost position). As indicated in FIG. 2, with apex 117-13 of bistable mechanism 170-1 at the fully retracted (i.e., in the graph, the leftmost) position, the potential energy stored by bistable mechanism 170-1 is at a minimum level. Note also that any movement of handle portion 168-1 in the forward direction A requires transferring (storing) potential energy in bistable mechanism 170-1, thus requiring a suitable amount of force determined by the spring constant of bistable mechanism 170-1.

Figure 3B:
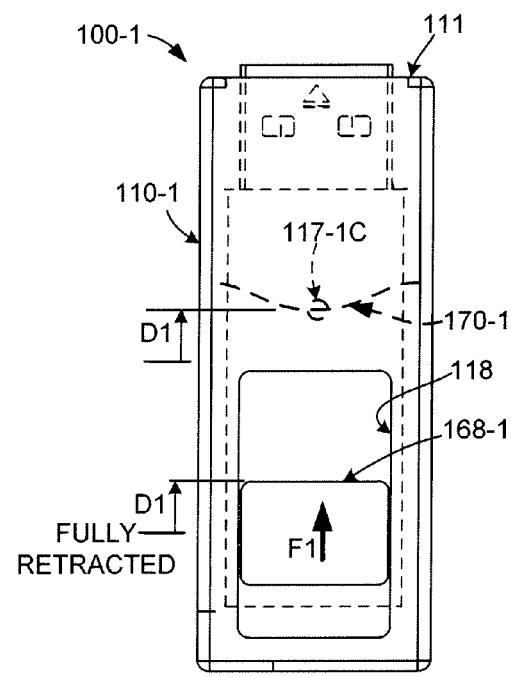

FIGS. 2 and 3(B) depicts a manual force F1 applied to handle structure 168-1 that is sufficient to displace handle structure 168-1 an arbitrary distance D1 along slot 118 in the longitudinal direction toward front end 111. This displacement of handle structure 168-1 results in a corresponding displacement of apex 117-13 inside housing 110-1 by distance D1 away from the fully retracted position. As shown by the curve in FIG. 2, the work required to displace apex 117-13 over the distance D1 is stored in the bistable mechanism 170-1 as potential energy amount PE1. Because distance D1 is located before equilibrium (switch-over) point E of the bistable member 170-1, if the applied force were subsequently removed from handle portion 168-1 at this point, the potential energy PE1 would return the bistable mechanism 170-1 to its initial (fully retracted) position. The benefit of this function is protection of plug connector 150 during transport (i.e., during non-operation periods when device 100-1 is carried, for example, in a user's pocket). That is, when an inadvertent force is briefly applied to handle structure 168-1 of device 100-1 and then removed, plug connector 150 may be briefly partially deployed, but then is immediately returned to the fully retracted position, thereby preventing plug connector 150 from prolonged exposure. In contrast, conventional devices that do not include bistable member 170-1 would remain partially deployed if the same force were applied, thus exposing its plug connector to contamination or damage that could result in malfunction of device 100-1 and a corresponding loss of data.

FIGS. 2 and 3(C) depicts the application of a force F2 on handle structure 168-2 along slot 118 that moves apex 171-13 a distance D2, which corresponds to equilibrium point E of bistable member 170-1. The work required to reach equilibrium point E from the fully-retracted (non-inverted) shape is equal to the loading force applied over a distance D2, and is referred to herein as the change-over energy. As shown in FIG. 2, manual application of the change-over energy causes bistable member 170-1 to store the maximum potential energy $PE_{max}$ associated with equilibrium point E, and effectively causes a change-over between the retracted and deployed states. That is, as mentioned above, when apex 171-13 is displaced beyond the equilibrium point E, the bistable member 170-1 becomes unstable, and the stored potential energy $PE_{max}$ is exerted to invert the bistable member 170-1 into the fully deployed (inverted) shape shown in FIG. 3(D), where plug connector 150 is fully deployed outside housing 110-1. As such, after applying change-over energy F2, the user experiences a sudden drop in resistance to the user's applied pushing force as handle structure 168-1 "snaps" forward in to the fully deployed position (i.e., apex 171-13 is displaced in the X direction from its original position by an inverted distance D3). The user is now able to insert fully deployed plug connector 150 into a host system in the manner described above.

Referring to FIGS. 2 and 3(E), after operation of device 100-1 is completed and plug connector 150 is removed from the host system, a user restores plug connector 150 to the fully retracted position by applying a force F3 along the longitudinal direction toward rear portion 113 of housing 110-1. Similar to the deploying operation, manual force F3 displaces handle structure 168-1 (e.g., by an arbitrary distance D4) along slot 118. This displacement of handle structure 168-1 results in a corresponding displacement of apex 117-13 inside housing 110-1 by distance D3 away from the fully deployed position. As shown by the curve in FIG. 2, the work required to displace apex 117-13 over the distance D3 is stored in the bistable mechanism 170-1 as potential energy amount PE2. Similar to the deploying operation, if the applied force F3 were removed from handle portion 168-1 at distance D3 (i.e., before equilibrium point E), the potential energy PE2 would return the bistable mechanism 170-1 to the fully deployed position. The benefit of this function is to maintain plug connector 150 in the fully deployed position during use, allowing proper insertion into a host system. Referring to FIG. 2, in order to fully retract plug connector 150 into housing 110-1 after use, the user must slide handle portion 168-1 over a distance D5, whereby bistable member 170-1 is pushed past equilibrium point E, causing the stored potential energy $PE_{max}$ to re-invert the bistable member 170-1 into the fully retracted shape shown in FIG. 3(A), whereby plug connector 150 "snaps" back into the fully retracted position.

Figure 4:
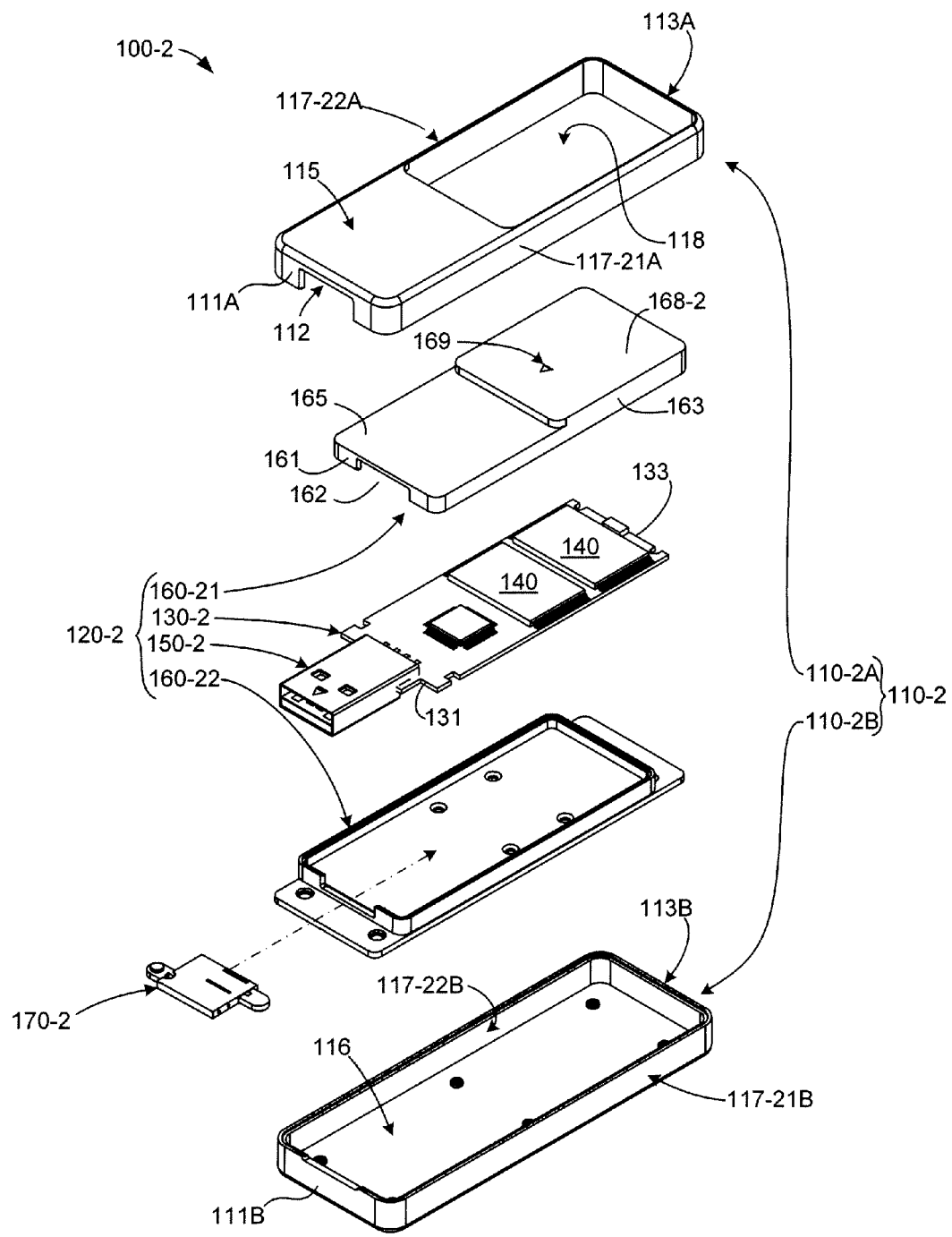
FIG. 4 is an exploded perspective view showing a pen-type USB flash memory device according to a specific embodiment of the present invention.

FIG. 4 is a perspective top view showing a pen-type (i.e., retractable) computer peripheral device 100-2 according to a specific embodiment of the present invention. Device 100-2 generally includes a two-part housing 110-2, slidable assembly 120-2, and a bistable spring mechanism 170-2 that function in a manner similar to the structures described above with reference to device 100-1.

Two-part housing 110-2 provides a convenient mechanism for assembling device 100-2 by allowing slidable assembly 120-2 and PCB 130-2 to be securely mounted onto a portion of the housing before enclosing these structures using the other portion. Referring to FIG. 4, two-part housing 110-2 generally includes an upper housing portion 110-2A and a lower housing portion 110-2B, both comprising integrally molded (single-piece) plastic structures that are formed using well-known injection molding techniques. Upper housing portion 110-2A includes a front end portion 111A that defines a front opening 112, a rear (second) portion 113A, an upper wall 115, and opposing elongated side wall portions 117-21A and 117-22A that extend downward from the side edges of upper wall 115. Upper wall 115 defines a positioning slot 118 that extends in the longitudinal direction of housing 110-2. Lower housing portion 110-2B includes a front end portion 111B, a rear (second) portion 113B, an elongated lower wall 116, and opposing elongated side wall portions 117-21B and 117-22B that extend upward from the side edges of lower wall 116.

As indicated in FIG. 4, slidable assembly 120-2 includes a PCB 130-2 having at least one IC device 140 mounted adjacent to rear portion 133 of PCB 130-2 in the manner described above, a plug connector 150 fixedly mounted to front portion 131 of PCB 130-2, and a two-part manual positioning member including a slide base plate 160-21 and a sliding mechanism 160-22 that are assembled as described below.

PCB 130-2 is a substantially identical to PCB 130-1 (described above), but includes features and peripheral shapes that allow fixed mounting of PCB 130-2 onto sliding mechanism 160-22 in the manner set forth below. IC devices 140 and plug connector 150 are also substantially identical to those described above, and therefore further description is omitted here for brevity.

As depicted in FIG. 4, slide base plate 160-21 is an integrally molded (single-piece) plastic structure including a front wall 161 defining a front opening 162, peripheral side walls 163, an upper wall 165 and a raised handle structure 168-2. A protruding mold symbol 169 is disposed on raised handle structure 168-2 that provides a forward pointing arrowhead mark.

Figure 5:
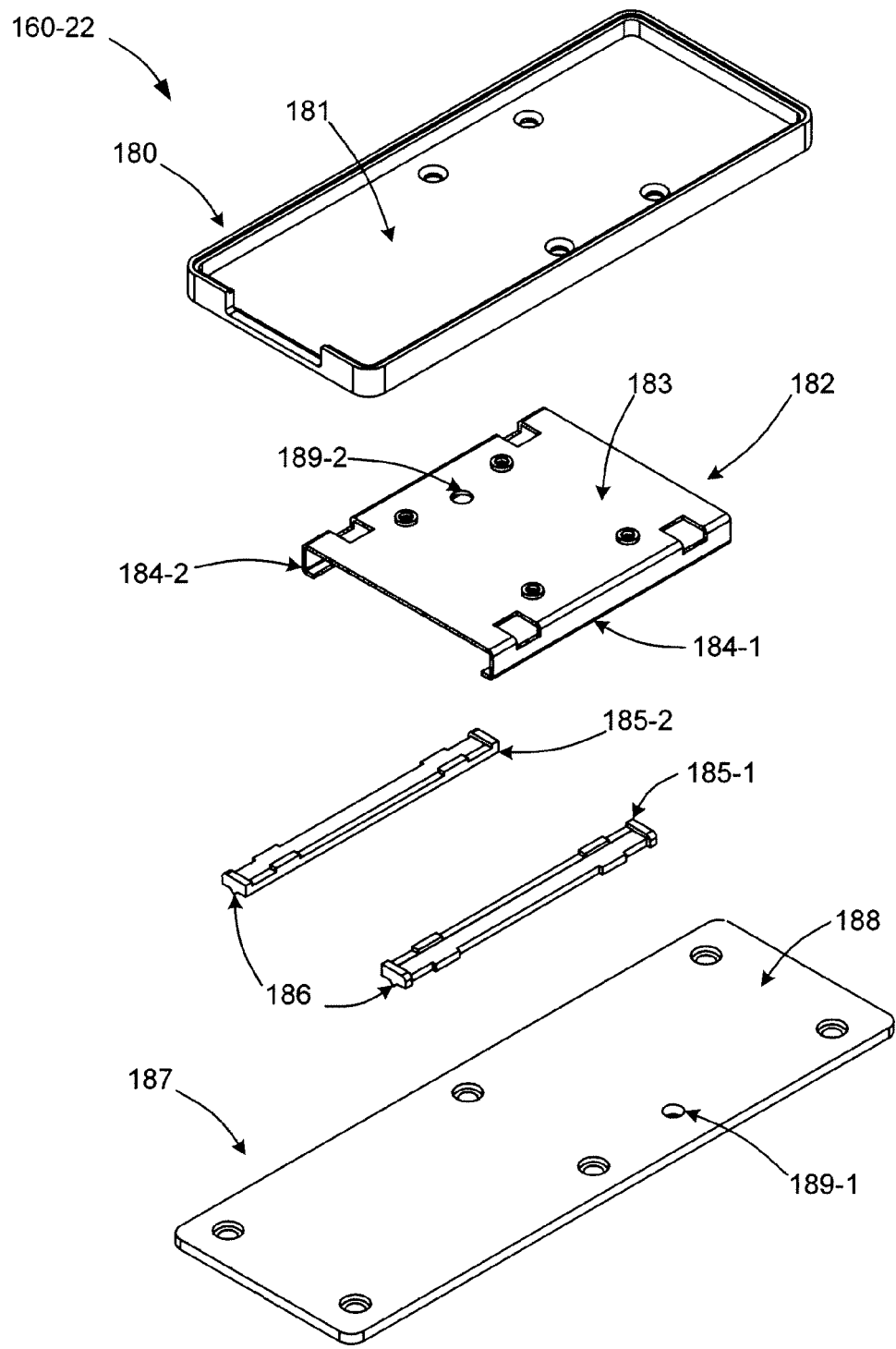
FIG. 5 is an exploded top perspective view showing a slidable assembly utilized in the device of FIG. 4.

FIG. 5 is an exploded perspective view showing sliding mechanism 160-22, which serves to facilitate reliable sliding of PCB 130-2 inside housing 110-2 in order to facilitate smooth transitions of plug connector 150 between the fully retracted and fully deployed positions. Sliding mechanism 160-22 generally includes a sliding boat 180 having an upper surface 181 for receiving PCB 130-2 as described below, a rail bracket plate 182 including a platform surface 183 for supporting sliding boat 180, and two side rails 184-1 and 184-2 that depend from opposite side edges of platform 183, a pair of plastic skid structures 185-1 and 185-2, each having an elongated sliding edge 186, and a slide base plate 187 having a smooth, flat sliding surface 188. As indicated in FIG. 5, sliding boat 180, rail bracket plate 182 and slide base plate 187 define screw holes that are utilized during assembly as described below. In addition, a first connection hole 189-1 is defined in sliding surface 188, and a second connecting hole 189-2 is defined in platform surface 183 that facilitate connection of bistable mechanism 170-2 as described below.

Referring again to FIG. 4, according to an aspect of the present invention, bistable mechanism 170-2 is incorporated inside sliding mechanism 160-22, as indicated by the dot-dash arrow and described in additional detail below, thereby minimizing the amount of volume required inside housing 110-2 to house bistable mechanism 170-2 and also providing additional benefits set forth below.

FIG. 5 is an exploded perspective view showing sliding mechanism 160-22, which serves to facilitate reliable sliding of PCB 130-2 inside housing 110-2 in order to facilitate smooth transitions of plug connector 150 between the fully retracted and fully deployed positions. Sliding mechanism 160-22 generally includes a sliding boat 180 having an upper surface 181 for receiving PCB 130-2 as described below, a rail bracket plate 182 including a platform surface 183 for supporting sliding boat 180, and two side rails 184-1 and 184-2 that depend from opposite side edges of platform 183, a pair of plastic skid structures 185-1 and 185-2, each having an elongated sliding edge 186, and a slide base plate 187 having a smooth, flat sliding surface 188. As indicated in FIG. 5, sliding boat 180, rail bracket plate 182 and slide base plate 187 define screw holes that are utilized during assembly as described below. In addition, a first connection hole 189-1 is defined in sliding surface 188, and a second connection hole 189-2 is defined in platform surface 183 that facilitate connection of bistable mechanism 170-2 as described below.

Referring again to FIG. 4, according to an aspect of the present invention, bistable mechanism 170-2 is incorporated inside sliding mechanism 160-22, as indicated by the dot-dash arrow and described in additional detail below, thereby minimizing the amount of volume required inside housing 110-2 to house bistable mechanism 170-2 and also providing additional benefits set forth below.

Figure 6A:
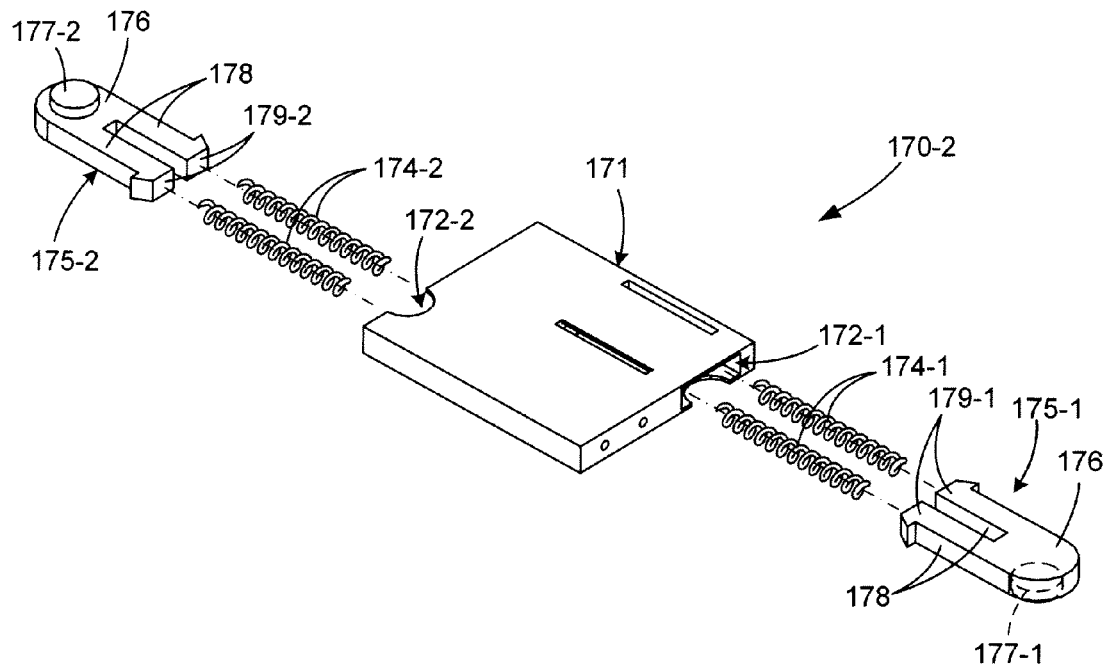
FIGS. 6(A) and 6(B) are exploded perspective and simplified top views, respectively, showing a bistable mechanism utilized in the device of FIG. 4.

FIG. 6(A) is an exploded perspective view showing bistable mechanism 170-2 in additional detail. Bistable mechanism 170-2 includes a plastic spring housing 171 defining first and second openings 172-1 and 172-2, metal coil springs 174-1 and 174-2 that are inserted inside housing 171 through openings 172-1 and 172-2, respectively, and plastic spring retention structures 175-1 and 175-2 that serve to retain springs 174-1 and 174-2 inside housing 171 as described below. Each spring retention structure 175-1 and 175-2 includes a base section 176 and a pair of arms 178 that extend from base section 176. Disposed on base section 176 of spring retention structure 175-1 is a downward facing stub 177-1, and an upward facing stub 177-2 is disposed on base section 176 of spring retention structure 175-2. A pair of pawls 179-1 are disposed at the free ends of arms 178 of spring retention structure 175-1, and a pair of pawls 179-2 are disposed at the free ends of arms 178 of spring retention structure 175-2.

Figure 6B:
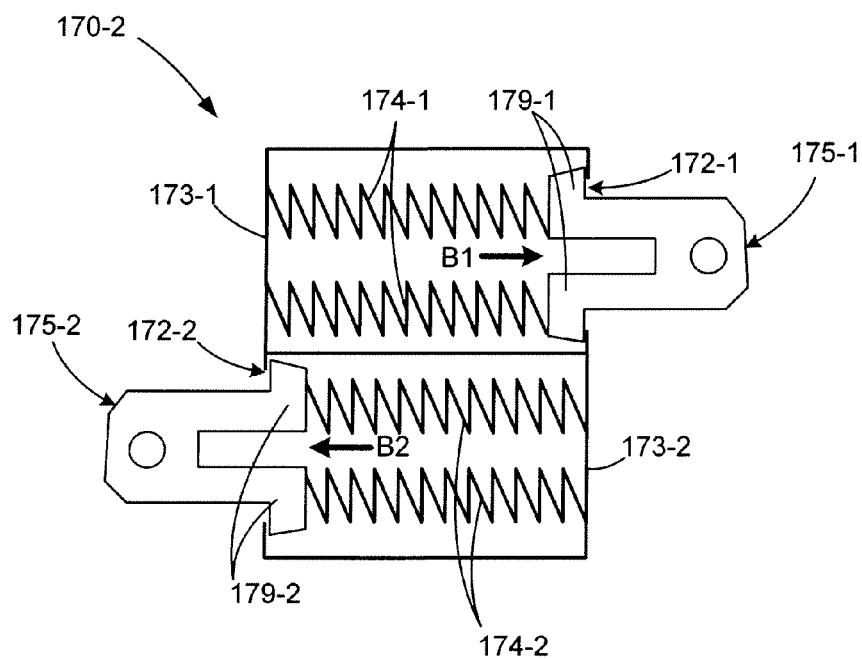

FIG. 6(B) is a simplified drawing showing bistable mechanism 170-2 in an assembled state. After inserting springs 174-1 into spring housing 171 through opening 172-1, spring retention structure 175-1 is attached by snap-coupling pawls 179-1 through opening 172-1 such that springs 174-1 press against pawls 179-1 in the direction of arrow B1 (i.e., outward from spring housing 171). Note that outward movement of spring retention structure 175-1 is limited by the wall structure defining opening 172-1. Similarly, springs 174-2 are inserted into spring housing 171 through opening 172-2, and spring retention structure 175-2 is attached by snap-coupling pawls 179-2 through opening 172-2 such that springs 174-2 press against pawls 179-2 in the direction of arrow B2, which is opposite to the direction of arrow B1. The advantage of this arrangement is described below with reference to FIGS. 12(A) to 12(D).

Figure 7:
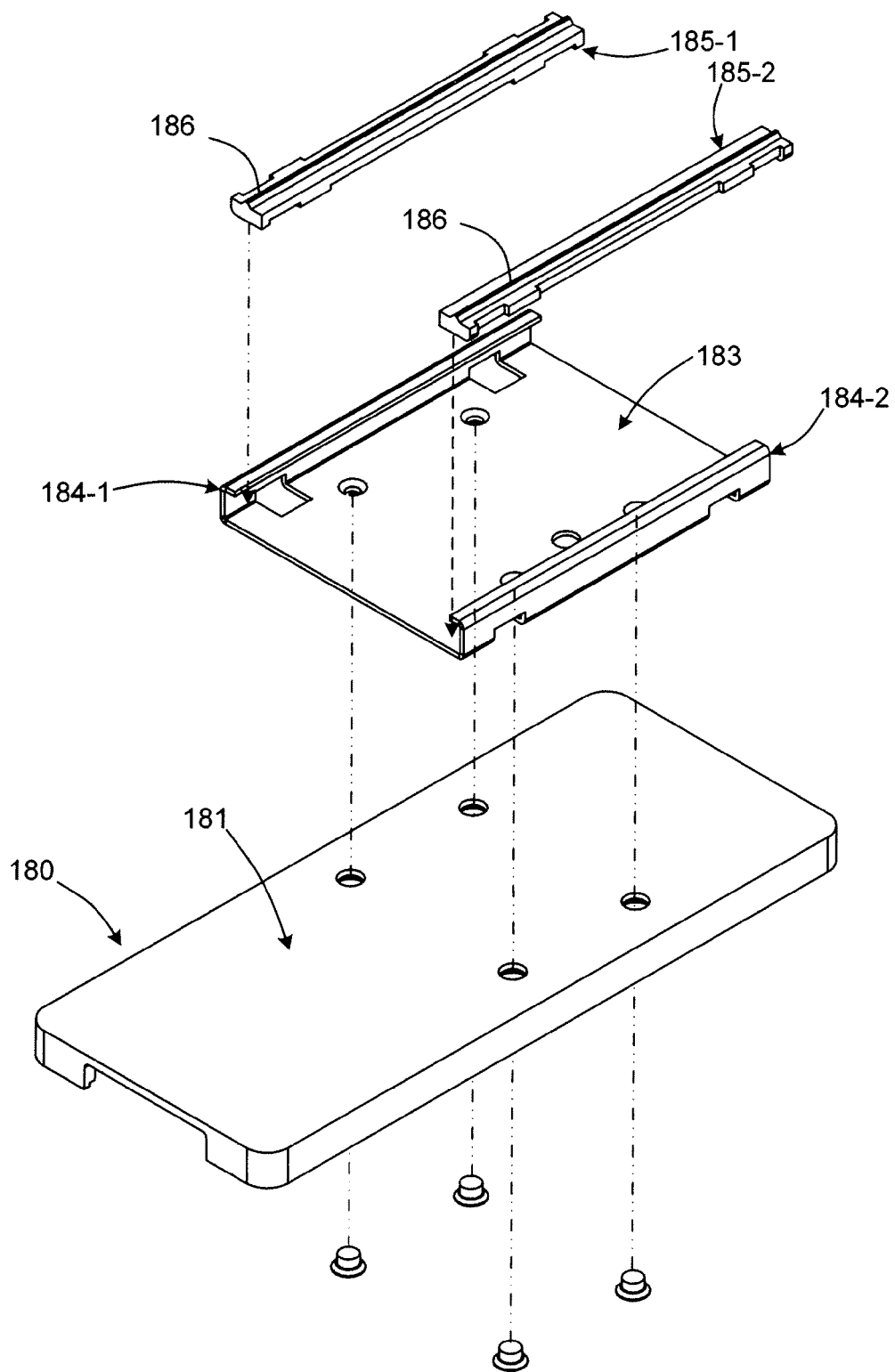
FIG. 7 is an exploded bottom perspective view showing a portion of the slidable assembly of FIG. 6 in additional detail.

FIG. 7 is an exploded bottom perspective view depicting a portion of the slidable assembly during a first stage of an assembly process according to another aspect of the present invention. As indicated in this figure, sliding boat 180 is fixedly connected to rail bracket plate 182 by way of screws that connect upper surface 181 to platform 183. In addition plastic skid structures 185-1 and 185-2 are fixedly attached to side rails 184-1 and 184-2, e.g., by snap-coupling. Note again that elongated sliding edges 186 of plastic skid structures 185-1 and 185-2 face away from sliding boat 180.

Figure 8:
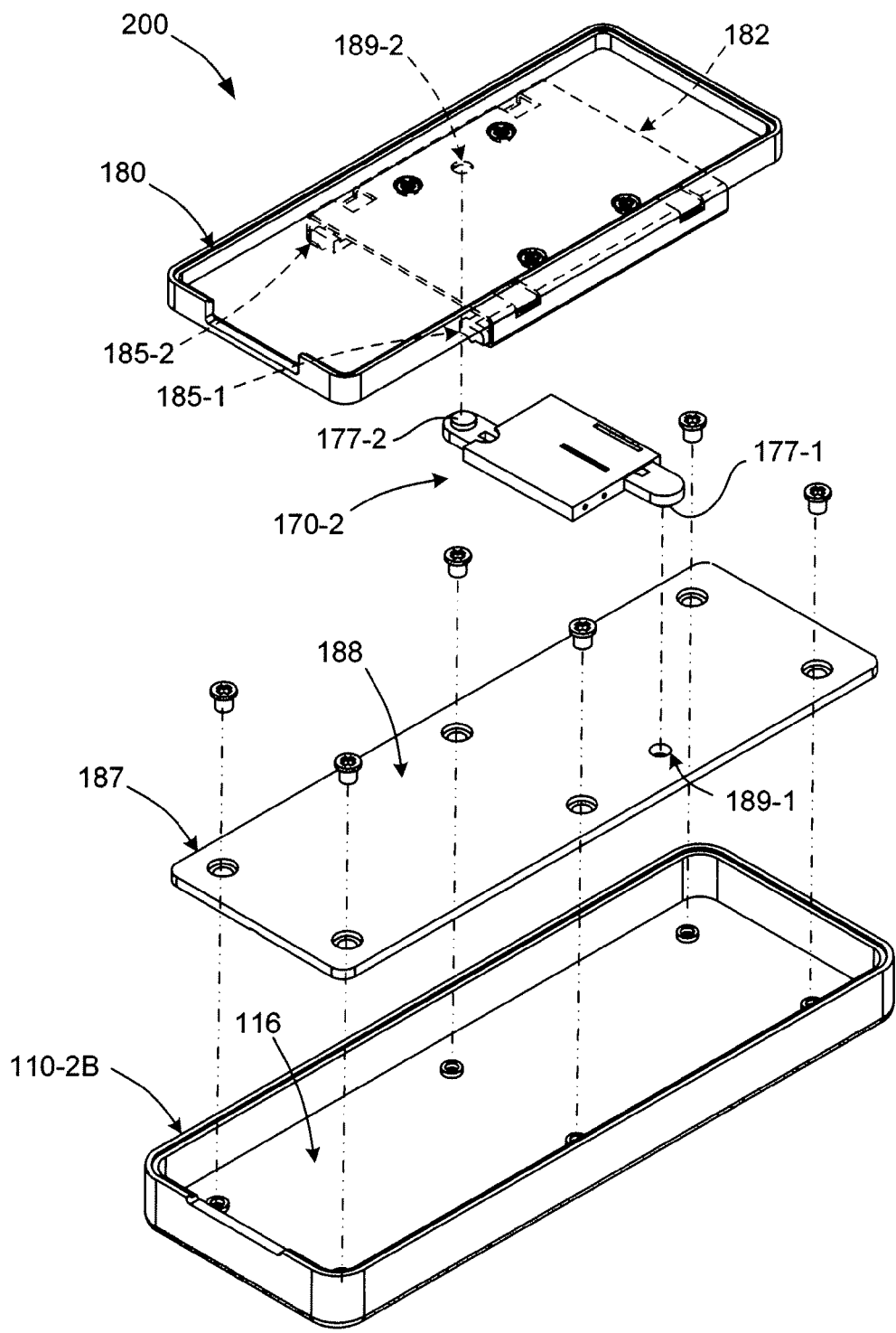
FIG. 8 is an exploded top perspective view showing the slidable assembly of FIG. 5 and the bistable mechanism of FIG. 6(A) during connection to a bottom housing portion formation to form a sub-assembly of the device of FIG. 4.

FIG. 8 is an exploded top perspective view depicting the formation of a sub-assembly 200 including lower housing portion 110-2B, slide base plate 187, bistable mechanism 170-2, and the partial assembly described above with reference to FIG. 5 including sliding boat 180, rail bracket plate 182, and plastic skid structures 185-1 and 185-2. As indicated in FIG. 8, slide base plate 187 is fixedly connected to lower housing portion 110-2B by way of screws such that sliding surface 188 faces upward away from lower wall 116. Bistable mechanism 170-2 is then mounted onto slide base plate 187 such that stub 177-1 is inserted into connection hole 189-1 defined in sliding surface 188. The partial assembly is then mounted over bistable mechanism 170-2 such that stub 177-2 is inserted into connection hole 189-1, which is defined in platform surface 183 of rail bracket plate 182.

Figure 9A:
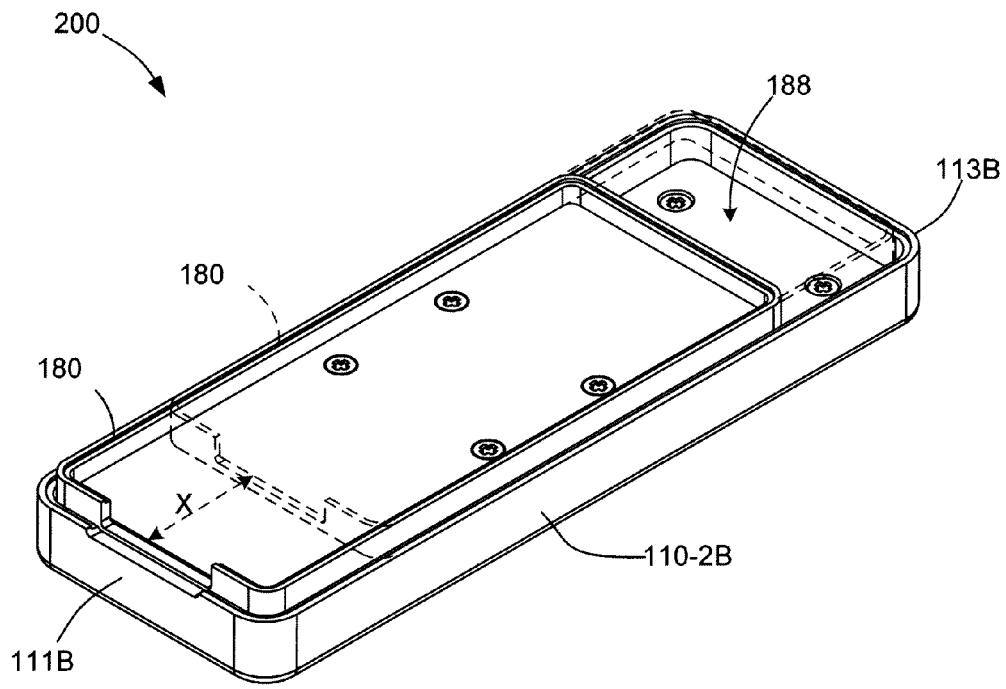
FIGS. 9(A) and 9(B) are perspective top and simplified cross-sectional end views showing the sub-assembly of FIG. 8.
Figure 9B:
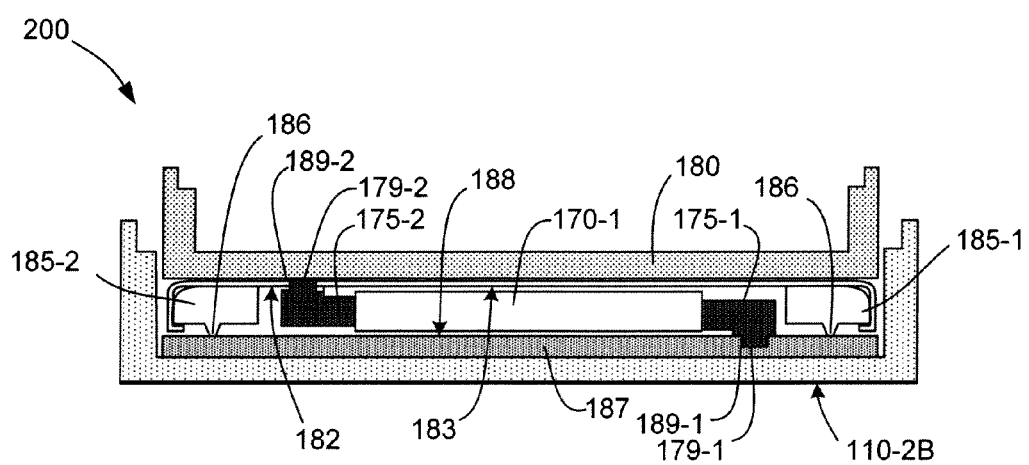

FIGS. 9(A) and 9(B) are perspective top and simplified cross-sectional end views showing sub-assembly 200 after completion of the assembly process depicted in FIG. 8. As indicated in FIG. 9(A), sub-assembly 200 is characterized by sliding movement of sliding boat 180 along longitudinal direction X between front portion 111B and rear portion 113B of lower housing portion 110-2B. As indicated in FIG. 9(B), the movement of sliding boat 180 is made possible by its connection to rail bracket plate 182, which in turn is supported by plastic skid structures 185-1 and 185-2 by way of sliding contact between elongated sliding edge 186 and sliding surface 188. Bistable mechanism 170-2 is disposed between and connected to the rail bracket plate 182 and the slide base plate 187 of the slidable assembly 120 in order to efficiently utilize the intervening space between platform surface 183 and sliding surface 188. In addition, the base portion of spring retention structure 175-1 is rotatably secured to slide base plate 187 by way of stub 179-1, which is inserted into connection opening 189-1. Similarly, the base portion of spring retention structure 175-2 is rotatably secured to rail bracket plate 182 by way of stub 179-2, which is inserted into connection opening 189-2.

Figure 10:
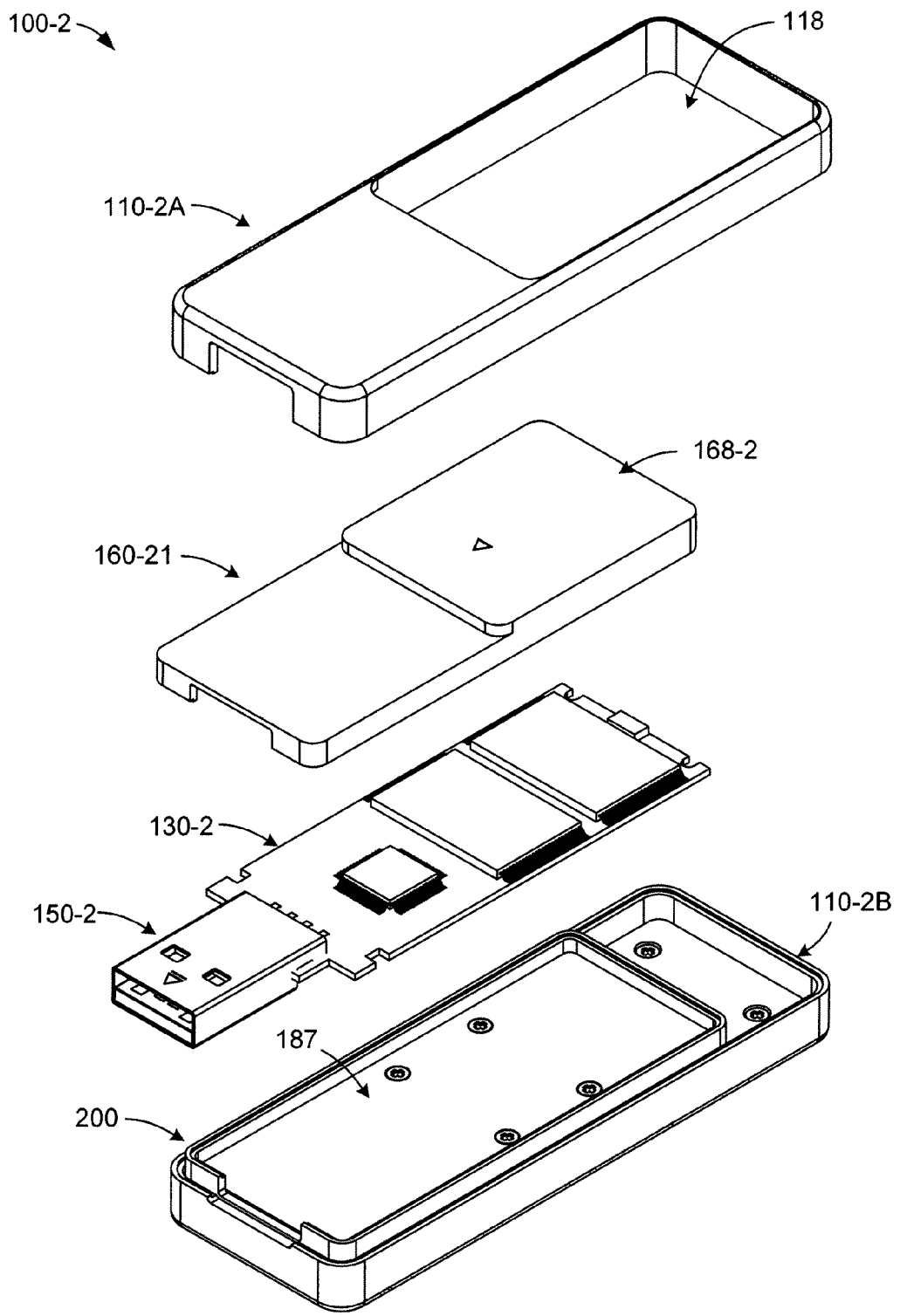
FIG. 10 is an exploded top perspective view showing final assembly of the device of FIG. 4.

FIG. 10 is an exploded top perspective view depicting a final assembly process for completing device 100-2. PCB 130-2 is mounted onto slide base plate 187 of sub-assembly 200, and then the peripheral edge of manual positioning member 160-21 is secured (e.g., by snap-coupling, ultrasonic welding, or adhesive) to the peripheral edge of slide base plate 187 over PCB 130-2. Upper housing portion 110-2A is then mounted onto lower housing portion 110-2B such that handle structure 168-2 extends through slot 118. The peripheral edge of upper housing portion 110-2A is then secured to the peripheral edge of lower housing portion 110-2B, e.g., by snap-coupling, ultrasonic welding, or using a suitable adhesive.

Figure 11A:
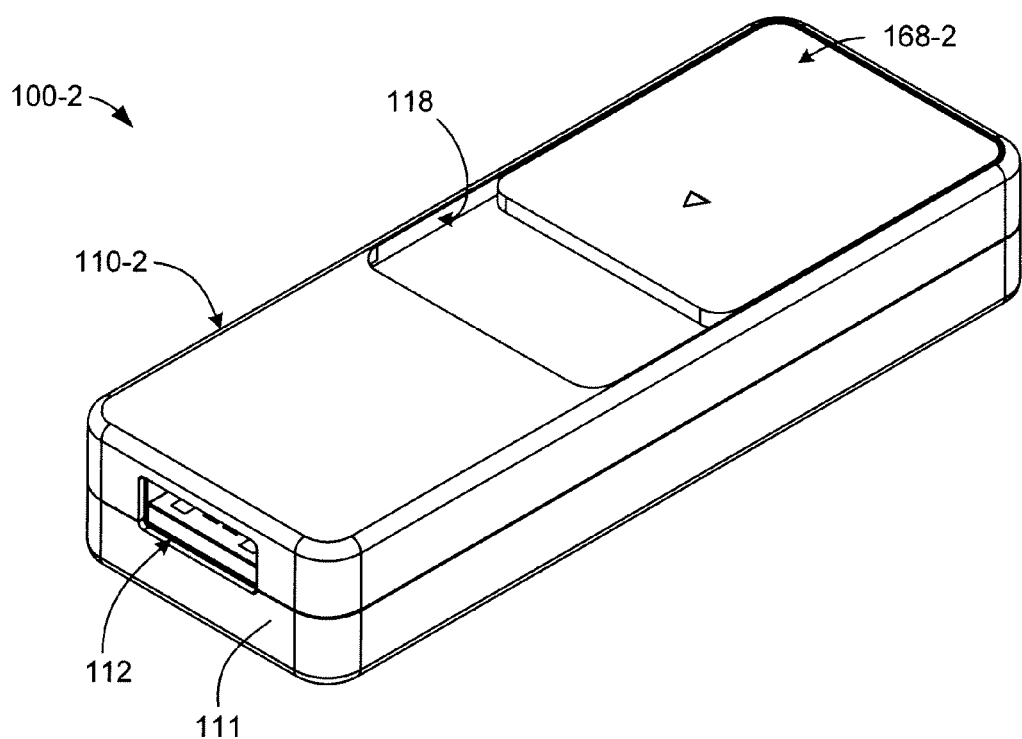
FIGS. 11(A) and 11(B) are top side perspective views showing the device of FIG. 4 in retracted and deployed states, respectively.
Figure 11B:
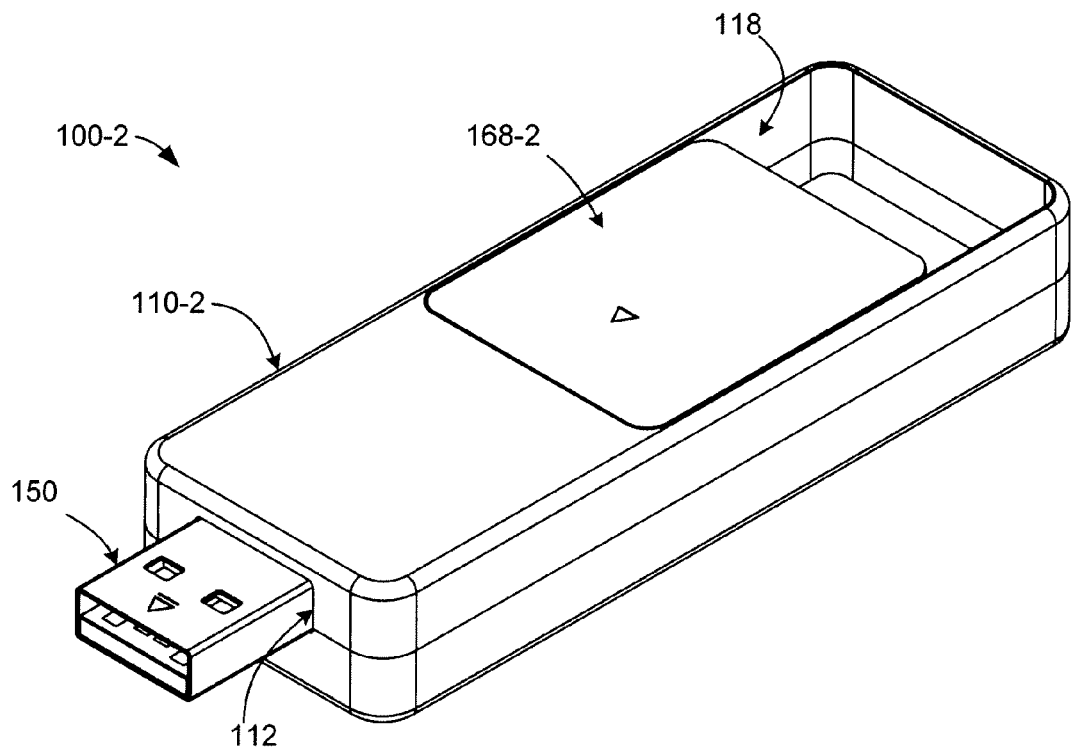

FIGS. 11(A) and 11(B) are perspective top views showing device 100-2 in a fully assembled state, whereby plug connector 150 is moved between the fully retracted position shown in FIG. 11(A) and the fully deployed position shown in FIG. 11(B) by way of manual force applied to handle structure 168-2, causing handle structure 168-2 to slide along slot 118 in a manner similar to that described above such that the PCB (not shown) is moved inside housing 110-2.

FIGS. 12(A) to 12(D) are simplified diagrams illustrating the operation of bistable mechanism 170-2 and the resulting relative displacement of housing 110-2 and PCB 130-2 during transition of device 100-2 from the fully retracted to the fully deployed positions. The following description is provided with reference to FIG. 2, which is described above.

FIG. 12(A) shows device 100-2 in the fully retracted position similar to that shown in FIG. 11(A). In this state PCB 130-2 is disposed at a rearmost position in housing 110-2 (and, hence, stud 177-2 of bistable mechanism 170-2 is also disposed in a rearmost position). With no force applied, springs 174 are fully extended, and spring retention structures 175-1 and 175-2 are pushed against the walls of spring housing 171 in the manner described above with reference to FIG. 6(A). Referring to FIG. 2, with bistable mechanism 170-2 in the fully retracted (i.e., in the graph, the leftmost) position, the potential energy stored by bistable mechanism 170-2 is at a minimum level.

FIG. 12(B) depicts the application of a manual force that displaces PCB 130-2 (by way of the handle structure) an arbitrary distance D1 inside housing 110-2. This displacement of PCB 130-2 results in a corresponding repositioning of stud 177-2 in the longitudinal direction inside housing 110-2 distance D1 away from the fully retracted position, causing a slight rotation of spring retention structure 175-2 in the clockwise direction as a result of the displacement. Note that stud 177-1 is fixedly positioned relative to housing 110-2, and therefore remains stationary as PCB 130-2 is moved, although spring retention structure 175-1 is rotated slightly in the clockwise direction as a result of the displacement of stud 177-2. Note also that the lateral distance L between studs 177-1 and 177-2 is fixed because PCB 130-2 (and, hence, rail bracket plate 182, to which stud 177-2 is connected) are confined to relative movement only in the longitudinal direction. Therefore, the rotation of bistable mechanism 170-2 forces spring retention structures 175-1 and 175-2 into spring housing 171, causing a slight compression of springs 174-1 and 174-2. Referring to the curve in FIG. 2, the work required to displace stud 177-2 over the distance D1 is stored in the bistable mechanism 170-2 as potential energy amount PE1. Because distance D1 is located before equilibrium (switchover) point E of the bistable member 170-2, if the applied force were subsequently removed, the potential energy PE1 would return the bistable mechanism 170-2 to its initial (fully retracted) position. Specifically, springs 174-1 and 174-2 would push outward on spring retention structures 175-1 and 175-2, respectively, which would generate a torque that would rotate spring housing counter-clockwise.

FIG. 12(C) depicts the application of a force F2 that moves PCB 130-2 a distance D2, which corresponds to equilibrium point E of bistable member 170-2. At this state, bistable mechanism 170-2 is rotated to a point that forces spring retention structures 175-1 and 175-2 to a maximum depth into spring housing 171, causing maximum compression of springs 174-1 and 174-2. As shown in FIG. 2, manual application of this change-over energy causes bistable member 170-2 to store the maximum potential energy $PE_{max}$ associated with equilibrium point E, and effectively causes a change-over between the retracted and deployed states. That is, as mentioned above, when stud 177-2 is displaced beyond the equilibrium point E, the bistable member 170-2 becomes unstable, and the stored potential energy $PE_{max}$ is exerted by springs 174-1 and 174-2 on spring retention structures 175-1 and 175-2 to produce a torque that rotates bistable member 170-2 in the clockwise direction, and into the fully deployed position shown in FIGS. 12(D) and 11B, where plug connector 150 is fully deployed outside housing 110-2. Once bistable mechanism 170-2 reaches the deployed (stable) state, assuming no external force is applied, springs 174-1 and 174-2 are again fully extended, and spring retention structures 175-1 and 175-2 are again pushed against the walls of spring housing 171 in the manner described above with reference to FIG. 6(A). Referring to FIG. 2, with bistable mechanism 170-2 in the fully deployed (i.e., in the graph, the rightmost) position, the potential energy stored by bistable mechanism 170-2 is again at a minimum level.

Although the present invention has been described with respect to certain specific embodiments, it will be clear to those skilled in the art that the inventive features of the present invention are applicable to other embodiments as well, all of which are intended to fall within the scope of the present invention. For example, those skilled in the art will recognize that each of USB devices 110-1 and 100-2 may be modified to implement COB-type and SMT-type USB PCBAs. In addition, the various device structures may be modified to implement other types of portable computer peripheral apparatus, for example, by modifying the plug connector to include an interface circuit and plug structure that supports Secure Digital (SD), Micro SD, Multi-Media Card (MMC), Compact Flash (CF), Memory Stick (MS), PCI-Express, a Integrated Drive Electronics (IDE), Serial Advanced Technology Attachment (SATA), external SATA, Radio Frequency Identification (RFID), fiber channel and optical connection protocols.

The invention claimed is:

1. A portable computer peripheral apparatus comprising:
    a housing having a front end portion defining a front opening, opposing side walls and opposing upper and lower walls extending back from the front end portion and defining a central cavity, and a rear wall covering a back portion of the central cavity;
    a slidable assembly comprising:
        a substrate disposed inside the housing;
        at least one electronic device fixedly mounted on the substrate;
        a plug connector fixedly connected to a front end of the substrate and electronically connected to said at least one electronic device; and
        a manual positioning member for slidably moving the substrate between a retracted position in which the plug connector is disposed inside the housing, and a deployed position in which the plug connector extends through the front opening; and
    a bistable mechanism connected between the slidable assembly and the housing, said bistable mechanism including at least one spring disposed to bias the slidable assembly relative to the housing into one of a first stable state in which the plug connector is in the retracted position and a second stable state in which the plug connector is in the deployed position, wherein said at least one spring is arranged to store a minimal potential energy when said plug connector is in either of the retracted position and the deployed position, and to store a maximum potential energy when said plug connector is in an equilibrium position between the retracted position and the deployed position.

2. The portable computer peripheral apparatus according to claim 1, wherein the bistable mechanism includes at least one coil spring arranged such that the coil spring is in a fully extended state in both the first stable state and the second stable state, and such that displacement of the plug connector out of one of the first stable state and the second stable state causes compression of the at least one coil spring, whereby the at least one spring stores potential energy.

3. The portable computer peripheral apparatus according to claim 2, wherein said at least one coil spring is further arranged such that said bistable mechanism defines an equilibrium point between the first stable state and the second stable state, and wherein movement of the plug connector over a first distance from the retracted position toward the deployed position causes said coil spring to store a maximum potential energy and said bistable mechanism to reach said equilibrium point, and further movement of the plug connector past the first distance causes said coil spring to release said stored potential energy, thereby causing said bistable mechanism to push said plug connector into said deployed position.

4. The portable computer peripheral apparatus according to claim 3, wherein said movement of the plug connector over the first distance requires applying a predetermined force to the manual positioning member.

5. The portable computer peripheral apparatus according to claim 3, wherein movement of the plug connector over a second distance from the deployed position toward the retracted position causes said coil spring to restore said maximum potential energy and said bistable mechanism to reach said equilibrium point, and further movement of the plug connector past the second distance causes said coil spring to release said stored potential energy, thereby causing said bistable mechanism to push said plug connector into said retracted position.

6. The portable computer peripheral apparatus according to claim 1, wherein the manual positioning member is fixedly connected to the substrate, and includes a handle portion that is at least partially exposed through a slot defined in one of said opposing side walls and opposing upper and lower walls of the housing.

7. The portable computer peripheral apparatus according to claim 6, wherein the bistable mechanism includes a first portion connected to the housing, a second portion connected to the slidable assembly, and at least one spring is arranged between the first and second portions such that sliding the handle portion relative to the housing causes the at least one spring to store potential energy.

8. The portable computer peripheral apparatus according to claim 1, wherein the substrate comprises a printed circuit board, said plug connector includes connections pins, and said at least one electronic device is mounted on said printed circuit board such that said connection pins are electrically connected to said at least one electronic device by way of conductive traces disposed on said printed circuit board.

9. The portable computer peripheral apparatus according to claim 1, wherein the plug connector comprises a Universal Serial Bus (USB) plug connector.

10. A portable computer peripheral apparatus comprising:
    a housing having a front end portion defining a front opening, opposing side walls and opposing upper and lower walls extending back from the front end portion and defining a central cavity, and a rear wall covering a back portion of the central cavity;
    a slidable assembly comprising:
        a substrate disposed inside the housing;
        at least one electronic device fixedly mounted on the substrate;
        a plug connector fixedly connected to a front end of the substrate and electronically connected to said at least one electronic device; and
        a manual positioning member for slidably moving the substrate between a retracted position in which the plug connector is disposed inside the housing, and a deployed position in which the plug connector extends through the front opening; and
    a bistable mechanism for biasing the slidable assembly relative to the housing into one of a first stable state in which the plug connector is in the retracted position and a second stable state in which the plug connector is in the deployed position,
    wherein the slidable assembly comprises a sliding mechanism including a sliding boat, a rail bracket plate fixedly connected to a lower surface of the sliding boat, and a pair of plastic skid structures that are fixedly mounted onto the rail bracket plate, each of said plastic skid structures including an elongated sliding edge that extends away from the from sliding boat, and
    wherein the substrate comprises a printed circuit board that is fixedly mounted onto the sliding boat.

11. The portable computer peripheral apparatus according to claim 10,
wherein the housing further comprises opposing upper and lower housing portions that collectively define the central cavity,
wherein the slidable assembly further comprises a slide base plate that is secured to the lower housing portion and includes a smooth, flat sliding surface, and
wherein the rail bracket plate is mounted inside the central cavity of the housing such that the sliding edge slidably abuts the smooth, flat sliding surface.

12. The portable computer peripheral apparatus according to claim 11, wherein the bistable mechanism is disposed between the slide base plate and the rail bracket plate.

13. The portable computer peripheral apparatus according to claim 12, wherein the bistable mechanism comprises a spring housing, a plurality of springs disposed inside the spring housing, and a pair of spring retention structures, each spring retention structure having a pair of pawls slidably inserted into the spring housing and contacting said plurality of springs such that said plurality of springs bias said spring retention structures outward from said spring housing, each spring retention structure also having a base portion including a stub that is rotatably coupled to one of said slide base plate and said rail bracket plate.

14. The portable computer peripheral apparatus of claim 1, wherein the plug connector includes an interface circuit including means for implementing one of a Universal Serial Bus (USB), a Secure Digital (SD), a Micro SD, Multi-Media Card (MMC), a Compact Flash (CF), a Memory Stick (MS), a PCI-Express, a Integrated Drive Electronics (IDE), a Serial Advanced a Technology Attachment (SATA), an external SATA, a Radio Frequency Identification (RFID), a fiber channel and an optical connection protocol.

* * * * *